(12) United States Patent
Maselli et al.

(10) Patent No.: US 9,945,142 B2
(45) Date of Patent: Apr. 17, 2018

(54) MODULAR DATA CENTER

(75) Inventors: Joseph B. Maselli, Grafton, MA (US); Scot Blessington, Wake Forest, NC (US); Robert J. Stein, Boston, MA (US)

(73) Assignee: FMR LLC, Boston, MA (US)

( * ) Notice: Subject to any disclaimer, the term of this patent is extended or adjusted under 35 U.S.C. 154(b) by 725 days.

(21) Appl. No.: 13/080,766

(22) Filed: Apr. 6, 2011

(65) Prior Publication Data

US 2012/0255710 A1 Oct. 11, 2012

(51) Int. Cl.
*E04H 5/02* (2006.01)
*H05K 7/14* (2006.01)
*H05K 7/20* (2006.01)
*E04H 5/00* (2006.01)

(52) U.S. Cl.
CPC ............ *E04H 5/02* (2013.01); *H05K 7/1497* (2013.01); *H05K 7/20745* (2013.01); *E04H 2005/005* (2013.01)

(58) Field of Classification Search
USPC ................................. 52/79.1, 79.7; 62/259.2
See application file for complete search history.

(56) References Cited

U.S. PATENT DOCUMENTS

| | | | |
|---|---|---|---|
| 3,755,973 A | 9/1973 | Rader | |
| 4,992,669 A * | 2/1991 | Parmley | ........................ 290/1 R |
| 6,279,279 B1 * | 8/2001 | Larimore | ..................... 52/302.1 |
| 7,278,273 B1 | 10/2007 | Whitted et al. | |
| 7,644,051 B1 * | 1/2010 | Moore et al. | .................... 706/21 |
| 7,971,446 B2 * | 7/2011 | Clidaras et al. | ............. 62/259.2 |
| 8,218,322 B2 * | 7/2012 | Clidaras et al. | .............. 361/701 |
| 8,514,572 B2 * | 8/2013 | Rogers | .......................... 361/695 |
| 2007/0204527 A1 * | 9/2007 | Clark | .............................. 52/79.1 |
| 2007/0213000 A1 * | 9/2007 | Day | .............................. 454/184 |
| 2008/0055846 A1 | 3/2008 | Clidaras et al. | |
| 2009/0107652 A1 * | 4/2009 | VanGilder et al. | .......... 165/80.2 |
| 2009/0168345 A1 * | 7/2009 | Martini | ........................ 361/691 |

(Continued)

OTHER PUBLICATIONS

PCT Notification of Transmittal of International Search Report and Written Opinion of the International Searching Authority from corresponding International Application No. PCT/US2001/042115, dated Nov. 3, 2011.

(Continued)

*Primary Examiner* — Paola Agudelo
(74) *Attorney, Agent, or Firm* — Walter G. Hanchuk; Hanchuk Kheit LLP

(57) ABSTRACT

A building system for housing electronic equipment is described. The building system includes a building stack that includes an instrumentation modular building unit, with an internal configuration of space in the instrumentation modular building unit configured to house electronics equipment, a power modular building unit, with an internal configuration of space in the power modular building unit storing power distribution equipment, power filtering equipment and uninterruptible power supplies and further configured to deliver electronic power to the instrumentation modular building unit; and a cooling modular unit comprising an air conditioner unit and a water chiller unit, with the instrumentation modular building unit, the power unit modular building unit and the cooling modular unit stacked together.

32 Claims, 8 Drawing Sheets

(56) References Cited

U.S. PATENT DOCUMENTS

| | | | |
|---|---|---|---|
| 2009/0229194 A1* | 9/2009 | Armillas | 52/79.1 |
| 2010/0136895 A1* | 6/2010 | Sgro | 454/184 |
| 2010/0170277 A1* | 7/2010 | Schmitt et al. | 62/259.2 |
| 2010/0223858 A1* | 9/2010 | Billings | 52/79.1 |
| 2010/0251629 A1* | 10/2010 | Clidaras et al. | 52/79.1 |
| 2010/0290197 A1 | 11/2010 | Bergthold et al. | |
| 2011/0047889 A1* | 3/2011 | Gad et al. | 52/79.1 |
| 2011/0138708 A1* | 6/2011 | Chazelle et al. | 52/173.1 |
| 2011/0239681 A1* | 10/2011 | Ziegler | 62/259.2 |
| 2011/0240265 A1* | 10/2011 | Dechene et al. | 165/104.31 |

OTHER PUBLICATIONS

"Redefining The Data Centre", Colt Technology Services, www.colt.net/dcs,, 2010.

\* cited by examiner

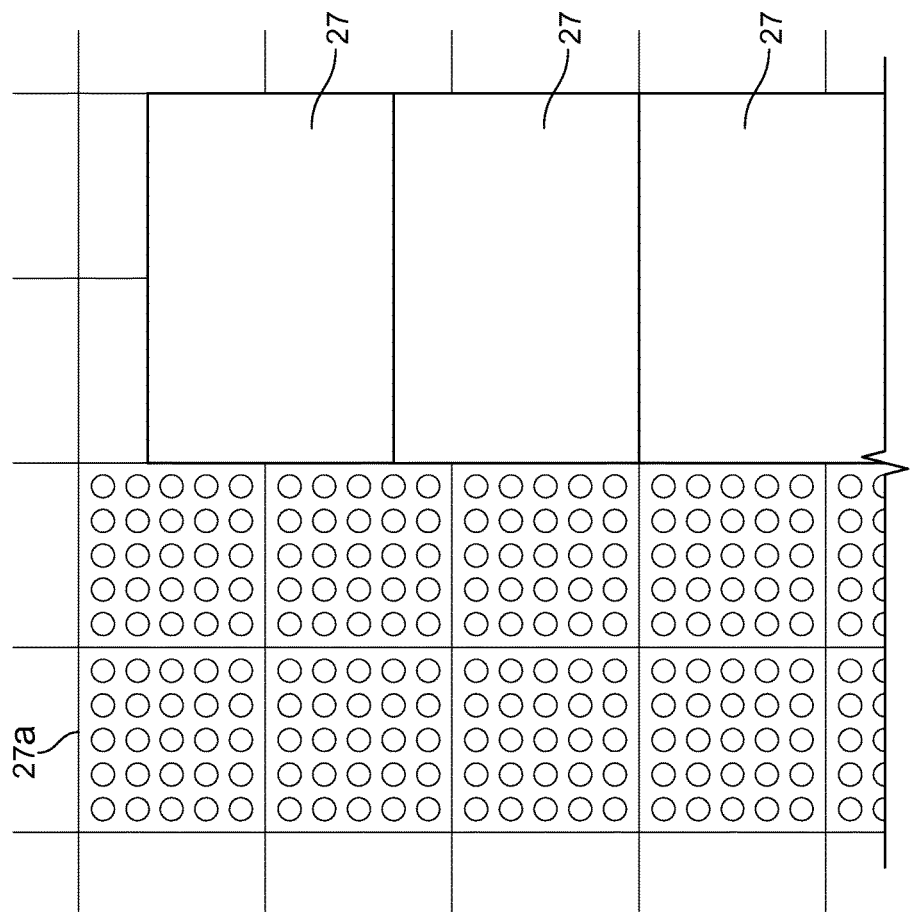

FIG. 7

| 12 | Stack of 16a, 26a, 36a or 26a, 16a, 36a | Stack of 16b, 26b, 36b or 26b, 16b, 36b | Stack of 16c, 26c, 36c or 26c, 16c, 36c | Stack of 16d, 26d, 36d or 26d, 16d, 36d | 12 | Stack of 16a, 26a, 36a or 26a, 16a, 36a | Stack of 16b, 26b, 36b or 26b, 16b, 36b | Stack of 16c, 26c, 36c or 26c, 16c, 36c | Stack of 16d, 26d, 36d or 26d, 16d, 36d | 12 |

10 (FIGS. 5 or 6) brackets each group of four stacks.

MODULAR DATA CENTER

BACKGROUND

This invention related generally to techniques to provide structures, such as buildings and the like, to house electronic equipment.

Various types of construction techniques are known. One type of construction technique is so called "stick-built" also referred to as "bricks and mortar" that generally refer to construction of a house or a commercial building for instance on site "stick by stick" or "brick by brick" to provide a complete structure. Another type of construction is pre-fabricated construction in which various structures are prefabricated typically in a factory and delivered to the site where the prefabricated structures are assembled on site to provide a complete structure.

Such structures such as buildings are used for various purposes. One such purpose that typically so called "brick and mortar" structures are used for is to house electronic equipment.

SUMMARY

When conventional structures are envisioned to house electronic equipment such as computer data centers (data centers), traditional stick-built or brick and mortar techniques require expenditure of significant capital to build capacity for a projected data center load. However, often the projected load is not presently needed and therefore the conventional structure is operated at a partial load. As demand grows eventually, the projected load capacity may be completely consumed ultimately justifying the initial capital expenditure albeit at a high financial inefficiency.

It would be desirable to provide a standardized configuration of a complete structure that can be readily adapted for various needs pertaining to housing of electronic equipment. Such a standardized configuration would be readily assembled and configured to provide a structure that can be quickly implemented with all supporting equipment to house such electronics equipment.

According to an aspect of the present invention, a building system for housing electronic equipment includes a building stack, the building stack including an instrumentation modular building unit, the instrumentation modular building unit having a plurality of sidewalls and a base connected to the sidewalls, with an internal configuration of space in the instrumentation modular building unit configured to house electronics equipment, a power modular building unit, the power modular building unit having a plurality of sidewalls and a base connected to the sidewalls, with an internal configuration of space in the power modular building unit storing power distribution equipment, power filtering equipment and uninterruptible power supplies and further configured to deliver electronic power to the instrumentation modular building unit and a cooling modular unit having a base and comprising an air conditioner unit and a water chiller unit, with the instrumentation modular building unit, the power unit modular building unit and the cooling modular unit connected together in a stacked configuration.

The following are embodiments within the scope of this aspect.

The power modular building unit is configured to be placed on a site foundation, the instrumentation modular building unit is configured to be stacked over the power unit modular building unit, and the cooling modular unit is configured to be stacked over instrumentation modular building unit. The building system has an air plenum unit disposed between the power modular building unit and instrumentation modular building unit. Disposed between the power modular building unit and cooling modular unit is an air plenum unit. The building system of further includes a generator room configured to house power generators, and is further configured to house power transformers disposed external to the building system.

The instrumentation modular building unit is configured to be placed on a site foundation, the power modular building unit is configured to stack over the instrumentation modular building unit, and the cooling modular unit is configured to be stacked over the power modular building unit. Disposed between the power modular building unit and instrumentation modular building unit is an air plenum unit. Disposed between the power modular building unit and cooling modular unit is an air plenum unit. The power modular building unit further houses a generator room configured to house power generators, and is further configured to house power transformers.

The building system has at least a second building stack of another instrumentation modular building unit, another power unit modular building unit and another cooling unit; with at least the instrumentation modular building unit of each stack forming a contiguous space between the first and the second building stacks. The building system has the instrumentation modular building units configured to provide a contiguous open space among the instrumentation modular building units.

The building system includes a roof structure that has a first cantilevered support attached to the instrumentation modular building unit to support over walls of the instrumentation modular building unit the air conditioner unit and the water chiller unit. The instrumentation unit includes a plurality racks, configured to house electrical equipment. The instrumentation modular building unit is configured to receive electrical power from one or more rows of power bus-way distribution units above the cabinets. The building system includes a circulation core module including at least one stair module, at least one elevator module, at least one loading dock module. The circulation core module provides access to both the power module building unit and the instrumentation modular building unit.

According to an aspect of the present invention, a building system for housing electronic equipment includes a plurality of building stacks, each building stack including an instrumentation modular building unit, the instrumentation modular building unit having a plurality of sidewalls and a base connected to the sidewalls, with an internal configuration of space in the instrumentation modular building unit configured to house electronics equipment, a power modular building unit, the power modular building unit having a plurality of sidewalls and abase connected to the sidewalls, with an internal configuration of space in the power modular building unit storing power distribution equipment, power filtering equipment and uninterruptible power supplies and further configured to deliver electronic power to the instrumentation modular building unit, and a cooling modular unit having a base connected comprising an air conditioner unit and a water chiller unit, with the instrumentation modular building unit, the power unit modular building unit and the cooling modular unit stacked together, with the respective units of each stack on the same level of the building systems and with at least the instrumentation units providing a contiguous, connected space.

The following are embodiments within the scope of this aspect.

The building system includes a circulation core module configured to provide access to a first one of the instrumentation modular building units and a first one of power modular building units, of one of the plurality of stacks, the circulation core includes at least one stair module, at least one elevator module, at least one loading dock module.

The power modular building units are configured to be placed on a site foundation, the instrumentation modular building units are configured to be stacked over the power unit modular building unit, and the cooling modular units are configured to be stacked over instrumentation modular building unit in each of the stacks.

The instrumentation modular building units are configured to be placed on a site foundation, the power modular building units are configured to be stacked over the instrumentation modular building units, and the cooling modular units are configured to be stacked over the power modular building units.

The building system includes a roof structure have a first cantilevered support attached to the instrumentation modular building unit to support over walls of the instrumentation modular building unit the air conditioner unit and the water chiller unit. The building system has the instrumentation modular building units configured to provide a contiguous open space among the instrumentation modular building units.

Other embodiments include building system having an air plenum unit disposed between the power modular building unit and instrumentation modular building unit. Disposed between the power modular building unit and cooling modular unit is an air plenum unit. The building system of further includes a generator room configured to house power generators, and is further configured to house power transformers disposed external to the building system.

The instrumentation unit includes a plurality racks, configured to house electrical equipment. The instrumentation modular building unit is configured to receive electrical power from one or more rows of power bus-way distribution units above the cabinets. The building system includes a circulation core module including at least one stair module, at least one elevator module, at least one loading dock module. The circulation core module provides access to both the power module building unit and the instrumentation modular building unit in at least one of the stacks.

One or more aspects of the invention may provide one or more of the following advantages.

The configuration of modules provide an instrumentation center that is a modular, scalable, flexible, and transportable arrangement having associated electrical and mechanical features to accommodate electronic instrumentation such as computer based data centers. The techniques described provide, a factory built, self-contained, stand-alone, e.g., modular data center that can be transported to an owner's site and rapidly assembled into a weather tight enclosure. The enclosure can be expanded by the addition of other modules, on as needed basis, which if financially efficient. The techniques provide a fully self-supporting enclosure that requires no outside connections, other than electric service and a data network. The arrangement of modules can be configured to provide a contiguous data-center space that can deploy mainframe, distributed rack-mount, large form-factor storage solutions, or any other footprint or density of hardware to accommodate various types of equipment.

The arrangement is scalable up or down. Modules can be decommissioned, removed and transported to an alternate location if business opportunities demand it. The arrangement eliminates the need for costly, inefficient bricks and mortar data center solutions, and delivers scalable, flexible, transportable and just-in-time compute space. The arrangement can be attached to an existing facility and/or deployed in a stand-alone setting.

The described approach segments functional requirements such as support functions of infrastructure, power and cooling, and operating space such as data center space rather that package such functions in single unitized container environments, or modular units requiring interior conditioned space.

DESCRIPTION OF DRAWINGS

FIG. 3A depicts an expanded view of a portion of FIG. 3.

FIG. 7 is a diagrammatical view depicted ganged modular instrumentation centers.

DETAILED DESCRIPTION

Figure 1:
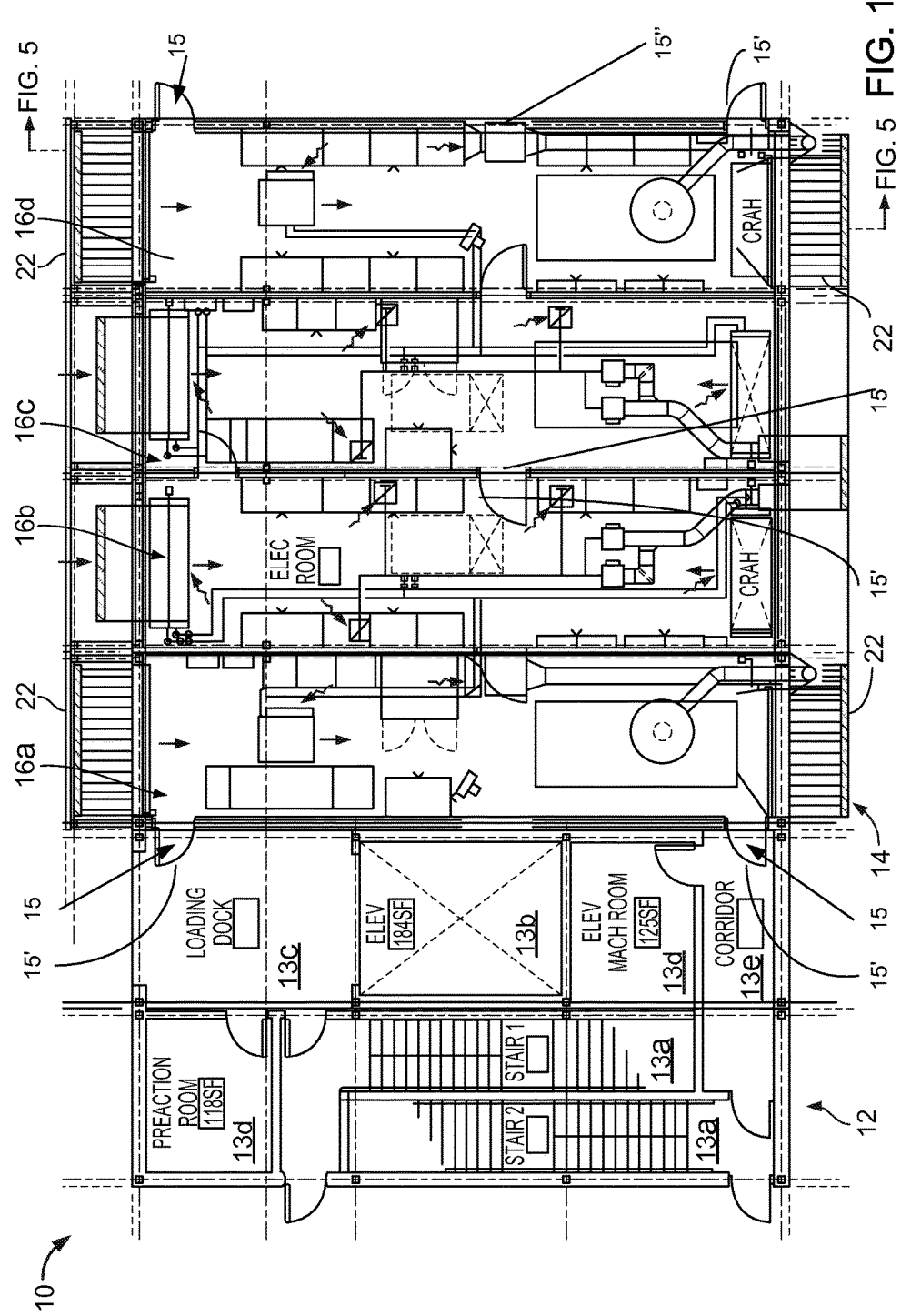
FIG. 1 depicts a plan view of one embodiment of a modular instrumentation center.

Referring to FIG. 1, a modular instrumentation center 10 (one example of which is a modular data center) is shown comprised of various modules. Each of the modules of the modular instrumentation center 10 has a base set of measurements according requirements of a road network and country regulations. For the United States, currently, a basic module would be typically no more than 13' wide, 50' long and 13'6" high such limitations on container dimensions are currently 15'-0" wide×55'-0" long×14'-0" high (per Interstate highway regulations limitations). Thus, the modules could be at large as those dimensions or smaller. In other embodiments in other countries the modules can be larger or smaller depending on the regulations of the particular country. Each module is fabricated off-site and transported to the site. Thus, from the basic dimensions mentioned above, four units form a modular instrumentation center 10 of 52' wide, 50' long and 54' in height.

In general, each type of module includes illustratively four walls with door-ways to accommodate doorways generally 15 for power modules 14. Unused doorways 15 on exterior walls (walls that not adjacent another module) can be provided with doors generally 15' that are locked or doorways with infill 15" (discussed below). The doors 15' can be placed in various locations along the walls to maximize ingress/egress, and for other considerations, such as fire safety. The doorways 15, doors 15' and infill 15" are referenced in FIG. 1 for some instances for clarity.

Generally, there are at least three types of modules, power generation 14, instrumentation 24, and cooling 34 that are stacked together along a vertical direction to produce self-contained instrumentation centers and which can that coupled together along a horizontal direction to produce a hall space effect (increase the floor space of the self-contained instrumentation center with associated power and cooling support. By instrumentation center is meant that the center includes electronic instruments, such as but not limited to computer systems, network systems, typically embodied in so called data centers. However, other types of electronics equipment can be included such as electronic instruments for measurement, etc.

In the most basic form of a complete structure, three modules are joined together to form a complete structure, along with a circulation core, (discussed below), which is the smallest site assembly. The smallest structure thus would be one power, one instrumentation and one cooling module with associated circulation core support.

As shown in FIG. 1, a first embodiment of a modular instrumentation center 10 includes an infrastructure portion circulation core module 12, that can be modularized, as mentioned below (or in some embodiments can stick-built (built on site)) that is disposed adjacent here four power modules 16a-d to provide a power generation core 14. In this embodiment, power generation is provided within the modular instrumentation center 10. Although detailed features are illustrated in FIG. 1, these are exemplary and are not referenced in detail herein or indeed needed be depicted in detail because they are not necessary to an understanding of the subject matter and would only serve to obfuscate other features.

Suffice it here to say that in the embodiment shown in FIG. 1, conventional power generators (not shown) are provided in power generation rooms 15a-15b in the modules 16a, 16d and convention power filtering and distribution networks (not referenced) are provided in the remaining modules 16b, 16c. In this configuration, two of the power modules 16b, 16c will include UPS, (uninterruptible power supplies) ATS equipment (automatic transfer switches) for power distribution, and required mechanical components, whereas the other two 16a, 16d will include generators and transformers for example. Typically, for four power modules there are four corresponding instrumentation modules and four corresponding cooling modules. This configuration provides associated electrical needs for instrumentation and the cooling modules that are stacked on top of the four power modules, as more fully illustrated in FIG. 5. Noise shielding 22 is provided at the ends of modules 16a and 16d to shield the surrounding environment from noise caused by the generators.

Infrastructure space is provided by the circulation core module 12 comprised of separate modules that include stairs 13a, elevators 13b, a loading dock 13c, auxiliary rooms 13d and a corridor 13e. Communications and monitoring will be maintained in a separate facility. Circulation core module includes here four modules, providing elevator and egress stairs to the first and second levels, i.e. power modules and instrumentation modules. In one configuration, two of the circulation core modules will serve Level 1 and the other two circulation core modules will serve the Level 2. Openings at exposed sides of module units are sized for doors. Infill material is provided for unused doorways, an exemplary material can be a translucent glazed system to allow light to enter. Other arrangements are possible.

Figure 2:
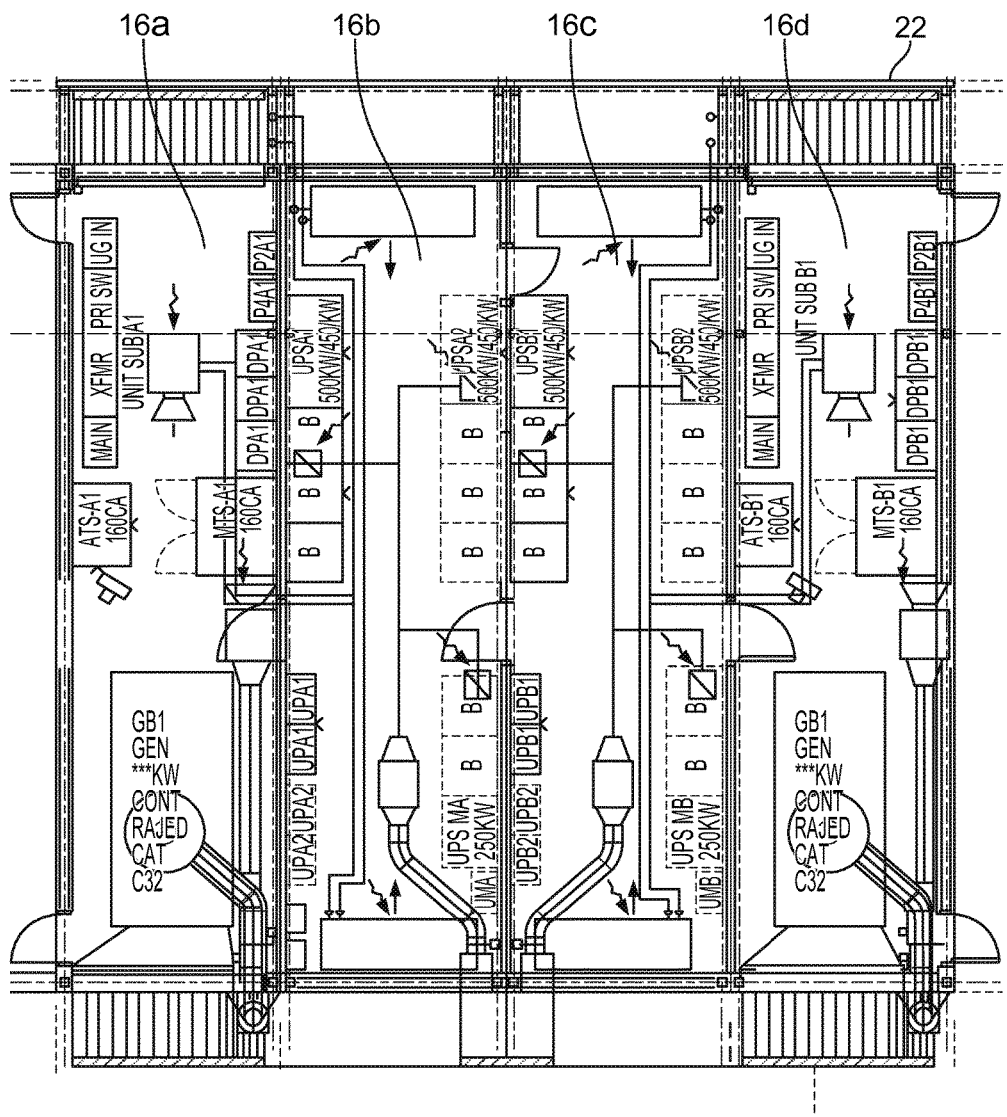
FIG. 2 depicts a plan view of one embodiment of a modularized power generation level.

Referring now to FIG. 2, the power modules 16a-16d are shown in more detail and encompassing two types one type with generators and transformers pre-positioned and affixed to the modules 16a, 16d, and the other type with filtering, UPS, and power distribution, pre-positioned and affixed to the modules 16b, 16c. The specifics of the types of equipment used and configuration and arrangement of the power equipment, e.g., switches, filtering, distribution, etc. can vary based on embodiments, as well as, needs of the instrumentation and cooling modules.

Figure 3:
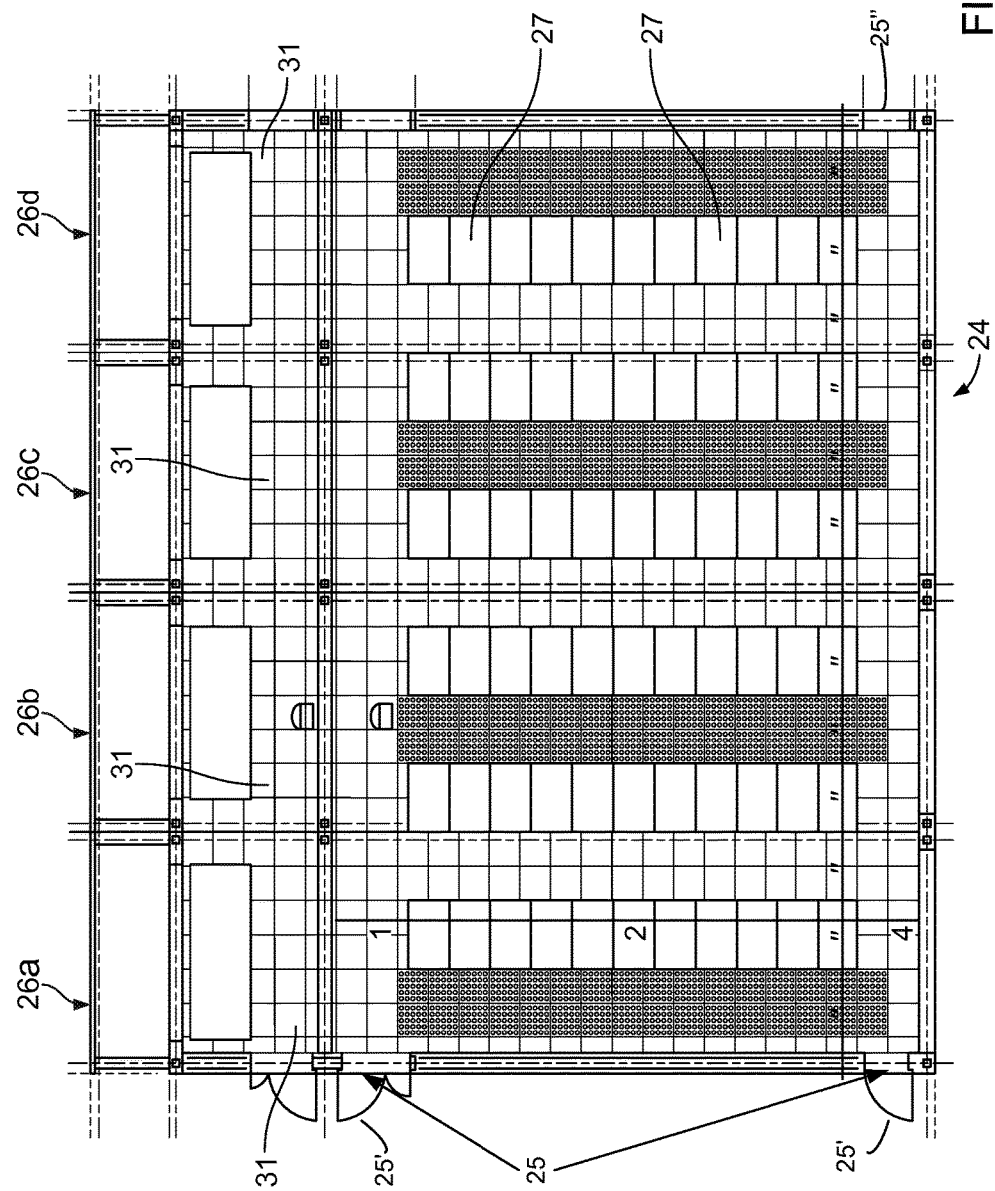
FIG. 3 depicts a plan view of one embodiment of a modularized instrumentation level.
Figure 5:
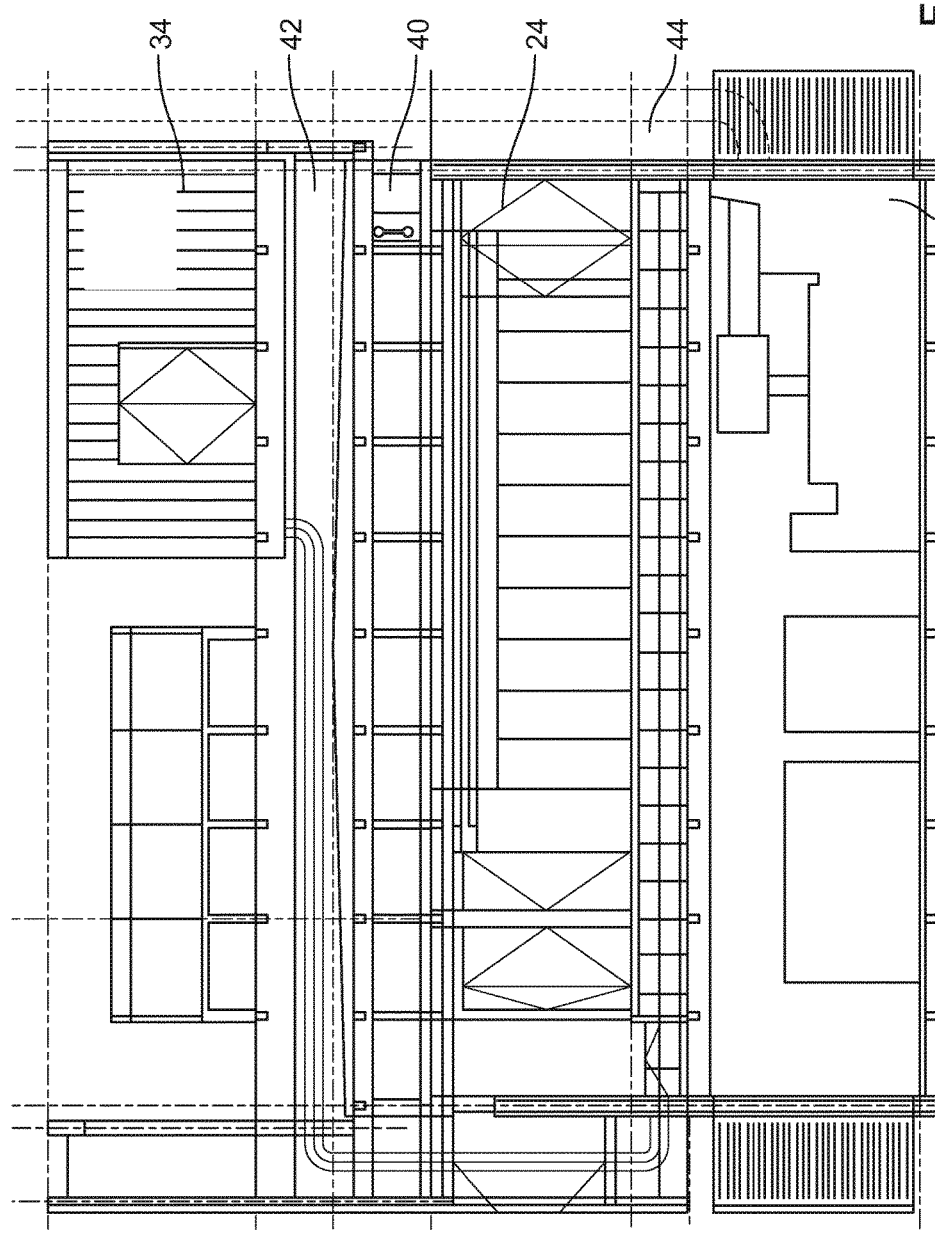
FIG. 5 is a cross sectional view taken along line 5-5 of FIG. 1, which depicts the modular instrumentation center, in a side view.

Referring now to FIG. 3, the instrumentation modules, 26a-26d here four (4) to correspond to the number of power generation modules 16a-16d (FIG. 1) is shown. The modular instrumentation center 10 of FIG. 1 requires the addition of a Plenum Unit 28 that provides a return air plenum and a roof assembly 29 above the instrumentation modules 26a-26d, as shown in FIG. 5. Within each of the instrumentation modules 26a-26d are cabinets/racks (generally denoted by 27) for housing electronic equipment such as computer systems, network routers, data switches, and other types of computer and/or instrumentation equipment. Dimensions can be selected to accommodate typical computer equipment requirements for 32" wide×48" deep computer rack dimensions.

Floors of the instrumentation modules 26a-26d are fabricated with flooring that is perforated 27a to allow cooling air to enter the instrumentation modules (shown in a detail in FIG. 3A) and the roofing of such instrumentation module can also be perforated to allow air to return through the return air plenum. Exemplary air paths are shown in FIG. 5 for a cooling plenum and a return plenum. A circulation corridor space 31 is provided at one of the ends of each instrumentation module. Doorways 25, doors 25' and infill 25" (referenced in FIG. 3 for some instances for clarity) are provided as illustrated.

Figure 4:
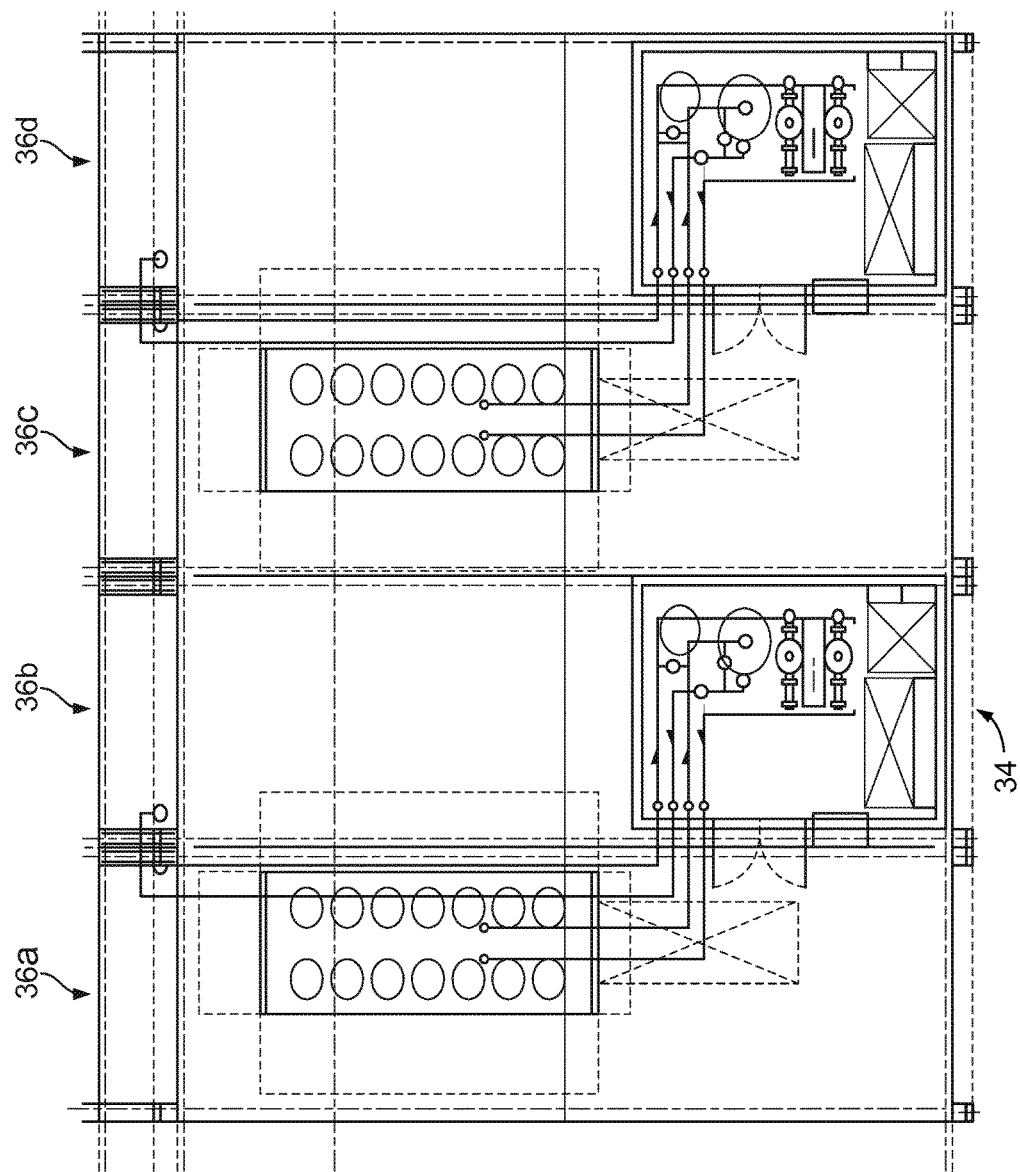
FIG. 4 depicts a plan view of one embodiment of a modularized cooling level.

Referring now to FIG. 4, cooling modules 36a-36d are shown. The cooling modules 36a-36d house air conditioner units, water chillers, associated water pumps, etc. needed to circulate chilled water and cool air through the power generation modules 16a-16d and the instrumentation modules 26a-26d. The cooling modules 36a-36d can have portions thereof enclosed rather than roofs over the entire extent of the modules 36a-36d.

For each of the power generation modules 16a-16d and the instrumentation modules 26a-26d roof girders of the module extend, e.g., +/−12" beyond the module's walls. Rooftop equipment connect to a cantilevered portion of the roof girder to avoid structural penetrations of the roof by the rooftop equipment. The rooftop equipment supports the chillers and pump house for each unit, as illustrated. Piping used for water and cool air runs vertically along short edge walls and penetrates the module through the end walls of the module rather than through the roof. Modules are connected together both when stacked vertically and when grouped horizontally, using various techniques such as bolting the modules or welding the modules. Bolting is preferred for those modules that may at some point be disassembled and relocated.

The modular instrumentation center 10 provides the efficiency of off-site assembly with a practical sequence of high-quality site preparation and installation. As a result, a three level the modular instrumentation center 10 is provided. In some embodiments, the modular instrumentation center 10 is configured as a modular data center that contains all mechanical, electrical and fire protection systems and elements needed to support the desired number and density of computer equipment racks.

The assembled the modular instrumentation center 10 has an exterior envelope equal to or better than minimum code requirements for total 'R' insulation values. The modular instrumentation center 10 is expandable to include more than or less than 4 base units per unit of infrastructure. In some implementations multiple modular instrumentation centers 10 can be ganged together with corresponding infrastructure units for further expansion and flexibility. These addition modular instrumentation centers 10 can typically be added without significantly interrupting operation of the modular instrumentation centers 10 currently in place. With the configurations described above each instrumentation unit can accommodate (66) Data Cabinets at 32" wide×48" long×84" high.

Referring now to FIG. 5, as was described by FIG. 1 was a so called "Type 1" modular instrumentation center 10 that provides the instrumentation modules at the second level with generators and substation located within the interior of the power modules on the first level. The type 1 configuration includes a Plenum Unit 40 above the instrumentation modules 26a-26d to provide a return for air and includes a roof assembly 42 above the instrumentation modules 26a-26d. The type 1 configuration also includes a Plenum Unit 44 below the instrumentation modules 26a-26d to supply cool air that is filtered up through the perforated floor of the instrumentation modules 26a-26d. The type 1 unit is particular useful in urban setting where land is expensive and/or shielding of the power generators are especially necessary.

Figure 6:
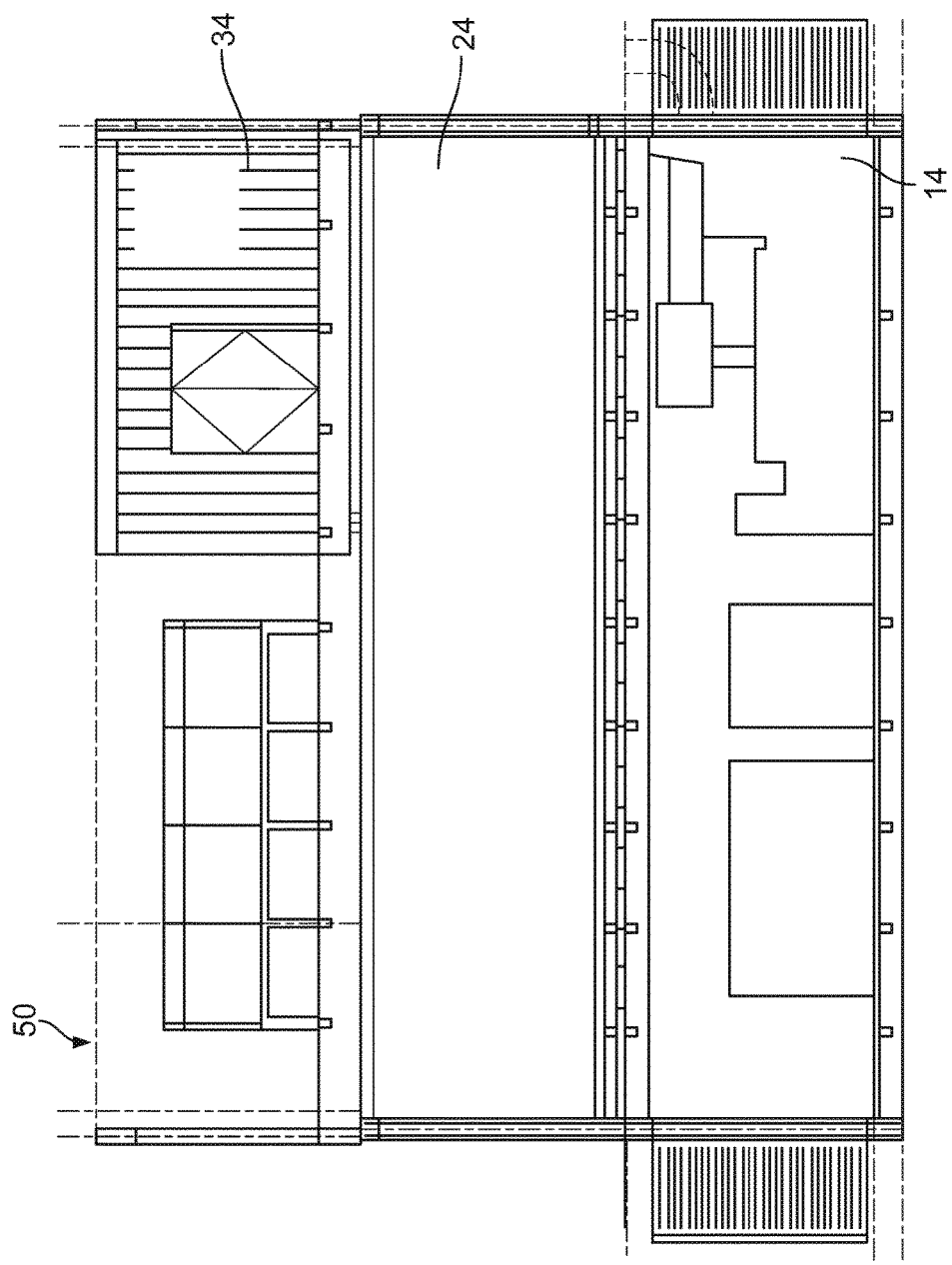
FIG. 6 is a cross sectional view, which depicts an alternative, modular instrumentation center in a side view.

Referring now to FIG. 6, a so called "Type 2" modular instrumentation center 50 is shown that provides the instrumentation module (FIG. 3) at the first level with power unit (FIG. 2) modified to include filtering, UPS, batteries, and distribution on the second level. Power generation is provided by generators and unit substations located on the exterior (outside of) the modular instrumentation center 10, e.g., adjacent to the modules. In all other respects the instrumentation, power and cooling modules used in this configuration 50 are similar in general construction configurations as modules 16a-16d, 26a-26d, and 36a-36d described above, taking into consideration the presence of the generators on the exterior of the modular instrumentation center 50.

Cabinet and access floor layout can be the same for both Type 1 and Type 2 modular instrumentation centers 10, 50. Security and Access Control devices can be integrated into the modular instrumentation centers 10, 50. Where two units are joined, connections between instrumentation modules 10, 50 are configured with typical door openings. The exterior walls are of a panelized metal system. Screening is along the perimeter of combined circulation core and instrumentation, power, cooling modules to conceal exterior components. The modules can be disassembled to enable potential relocation of the modules.

Referring now to FIG. 7 an exemplary configuration 70 of a pair of "ganged" modular instrumentation centers 10 (FIG. 1), is shown along with an extra circulation core 12. Here two such modular instrumentation centers 10 are provided with three circulation cores 12 disposed one either side of the ganged modular instrumentation center 70 and one between the pair of modular instrumentation centers 10. This figure is provided to illustrate the concept of ganging of modular instrumentation centers. Interior layout details of the modular instrumentation centers need neither be depicted in the figure nor referenced. For details the reader is referred to FIGS. 1-6 above. Other configurations are possible.

Generally, the site is prepared with typical utilities, egress etc. The site would include a foundation. Any type of foundation can be used such as convention poured concrete foundations, poured concrete piers configured to properly support the modules or indeed a concrete pad could be formed. Other arrangements are possible.

Set forth below are exemplary mechanical, electrical, cooling, and plumbing details that are applicable to various configurations of the modular instrumentation centers 10.

The power module 14 will include a 400/230V, 60 Hz power distribution system including HVAC equipment with electrical distribution equipment. The systems can be fault tolerant and include UPS (uninterruptible power supplies) with associated banks of storage batteries, etc., as needed. The batteries and the UPS are typically located in modules 16b and 16c (FIG. 2). In the Type 1 transformers and generators are disposed in exterior unit substation enclosures. The generators are exterior pad mounted units in common enclosures. The generators are configured in an N+1 configuration, whereas the UPS are configured in a 2N configuration, as known in the art.

Each generator will have a fuel tank to support 100% load for 24 hours. There can be two rows of power bus-way distribution units (not shown) above the cabinets 27 (FIG. 3) in the instrumentation modules 26a-26d (FIG. 3) with plug in circuit breaker connection point under the bus-ways for A/B power distribution with integral metering. There can also be two layers of cable tray (not shown) above the cabinets 27 (FIG. 3) for electrical wire and fiber optical cable distribution.

Cooling System can include two-50 ton Computer Room Air Handler (CRAH) units "A" side and Two-50 ton CRAH "B" side down-flow units on seismic floor stands.

CRAHs units include 100% air-side economizer, intake louver, relief fans, relief louver, dampers, and controls. The CRAHs include chilled water coils with 35% by mass Ethylene Glycol to water solution to provide a freezing point at about −0.2 F. Air is supplied the racks in the instrumentation modules via a 3'-0" deep raised floor plenum with 24"×24" perforated floor tiles in the "cold aisle." "Hot aisles" are completely contained with return air openings in the ceiling located between structural framing.

Chilled water is routed via piping (not shown) e.g., schedule 40 PVC or steel welded that is vertically routing along the exterior with entry into unit in the supply plenum section. Valves and flanges can be provided for future expansion of the modular instrumentation center 10.

The cooling modules also include a "Battery Exhaust," with two exhaust fans per electric room. One fan runs normally during operation. There are two hydrogen sensors per electric room to activate the second fan and an alarm (all not illustrated).

Generator Rooms in the power modules 16a, 16d are cooled by a horizontally suspended chilled water distribution system. Generator Room in the power modules 16a, 16d also include radiator cooling and combustion air supplied with outside air thru intake louvers and heat exhausted out thru exhaust louver on opposite side of unit. Intake and exhaust opening have sound attenuators 22 to prevent generator noise transmission through louvers to the outdoors.

Fire protection uses a double interlock pre-action system for the instrumentation modules and independent double interlock pre-action system for the power modules. A dry pipe system for the pump module and an independent dry pipe system for the Generator Module in Type 1 configurations can be used whereas a wet pipe system is used for the core circulation modules.

Walls, ceilings, floors of the modules can be fabricated in various manners. One such fabrication would use steel for walls and supports, using welding, or fasteners, as is conventionally done in steel building construction. Of course, the gauges, types of steel, etc. would be selected to withstand the static and dynamic loading of the modules. Other materials could be used such as composites (generally at a higher initial cost).

The modules are built in a factory, delivered via tractor trailer and assembled into a unit on site. When assembled, the final structure is fully self-contained and weather tight, needing only utilities and, e.g., network connections and the like. Floor space, power and cooling capacity are matched in the unit, and sized to fill short term needs. As those needs grow, additional units can be added, and the interior space becomes contiguous, while all interior space is weather-tight. The module system also allows relatively easy replacement of obsolete infrastructure, power and cooling systems as well as obsolete operational space.

It will be understood that various modifications may be made without departing from the spirit and scope of the application.

What is claimed is:

1. A building system, the building system comprising:
   a building stack of three units that are stacked one over the other in a vertical dimension, the building stack comprising:
   an instrumentation modular building unit having a plurality of sidewalls, at least one of the sidewalls having an opening to provide a door-way region for accommodating one of infill unit or door, a base connected to the sidewalls, with the instrumentation unit configured to house electronics equipment;
   a power modular building unit having a plurality of sidewalls, at least two of the sidewalls each having an opening to provide door-way regions for accommodating one of infill units or doors, and a base connected to the sidewalls, with the power modular building unit configured for housing power distribution equipment, to deliver electric power to the instrumentation unit and a cooling unit; and
   a cooling modular unit disposed over both the instrumentation modular building unit and the power unit modular building unit, and having a base and comprising an air conditioner unit and a water chiller unit support on the base, with the base of the cooling modular unit being connected to one of the instrumentation modular building unit and the power unit modular building unit.

2. The building system of claim 1 wherein the power modular building unit is placed on a site foundation, the instrumentation modular building unit is stacked over the power unit modular building unit, and the cooling modular unit is stacked over instrumentation modular building unit forming the vertical stack of three units.

3. The building system of claim 2 wherein disposed between the power modular building unit and instrumentation modular building unit is an air plenum unit.

4. The building system of claim 2 wherein disposed between the power modular building unit and cooling modular unit is an air plenum unit.

5. The building system of claim 2 further comprising:
   a generator room configured to house power generators, and with power transformers disposed external to the building system.

6. The building system of claim 1 wherein the instrumentation modular building unit is placed on a site foundation, the power modular building unit is stacked over the instrumentation modular building unit, and the cooling modular unit is stacked over the power modular building unit forming the vertical stack of three units.

7. The building system of claim 6 wherein disposed between the power modular building unit and instrumentation modular building unit is an air plenum unit.

8. The building system of claim 6 wherein disposed between the power modular building unit and cooling modular unit is an air plenum unit.

9. The building system of claim 6 wherein the power modular building unit further houses a generator room configured to house power generators and to house power transformers.

10. The building system of claim 1 wherein the building stack is a first building stack, the building system further comprising:
    a second building stack of three units that are stacked one over the other in a vertical dimension, the second building disposed horizontally against and attached to the first building stack, the second building stack comprising:
    a second instrumentation modular building unit having a plurality of sidewalls, at least one of the sidewalls having an opening to provide a door-way region for accommodating one of an infill unit or door, a base connected to the sidewalls, with the instrumentation unit configured to house electronics equipment;
    a second power modular building unit having a plurality of sidewalls at least two of the sidewalls having a pair of openings in the sidewalls to provide door-way regions for accommodating infill units or doors and a base connected to the sidewalls, with the power modular building unit configured for housing power distribution equipment, to deliver electric power to the instrumentation unit and a cooling unit; and
    a second cooling unit the second cooling modular unit disposed over both the second instrumentation modular building unit and the second power unit modular building unit, and having a base and comprising an air conditioner unit and a water chiller unit supported on the base, with the base of the second cooling modular unit being connected to a like one of the instrumentation modular building unit and the power unit modular building unit as the first building stack, with the first and the second instrumentation modular building units providing a contiguous user accessible open space provided by interiors of the first and second instrumentation module building units; and with the first and second power modular building units being user accessible by a first one of the pair of door-way regions of the power modular building unit and by a first one of the pair of door-way regions of the second power modular building unit between the first and the second building stacks.

11. The building system of claim 10 further comprising:
    a circulation core module comprising:
    at least one stair module, at least one elevator module, at least one loading dock module.

12. The building system of claim 11 wherein the circulation core is disposed adjacent the first building stack to provide user accessibility to the respective the power module building unit and the instrumentation modular building unit of the first building stack and with the first building stack providing user accessibility to the second building stack.

13. The building system of claim 10 wherein the instrumentation modular building units have sidewalls that are panelized.

14. The building system of claim 10 wherein the bases of the instrumentation modular building units are floor structures that are perforated.

15. The building system of claim 10 wherein roofs of the instrumentation modular building units are perforated.

16. The building system of claim 1, further comprising:
    a roof structure comprised of roof girders extending beyond walls of the instrumentation module building unit providing cantilevered portions, and with rooftop equipment connecting to the instrumentation module building unit through the cantilevered portions.

17. The building system of claim 1 wherein the instrumentation unit comprises:
a plurality of racks configured to house electrical equipment.

18. The building system of claim 1 wherein the instrumentation modular building unit comprises cabinets to house instrumentation equipment and receives electrical power from one or more rows of power bus-way distribution units above the cabinets.

19. The building system of claim 1 wherein at least some of the sidewalls of the instrumentation modular building units are panelized.

20. A building system for housing electronic equipment, the building system comprising:
a plurality of building stacks, each stack including a vertical stack of at least three modular building units, the plurality of building stacks disposed against and attached to an adjacent one of the building stacks in a horizontal dimension, each building stack comprising:
an instrumentation modular building unit, the instrumentation modular building unit having a plurality of sidewalls, a door in one of the sidewalls, and a base connected to the sidewalls, with an internal configuration of space in the instrumentation modular building unit configured to house electronics equipment;
a power modular building unit, the power modular building unit having a plurality of sidewalls and a base connected to the sidewalls, with an internal configuration of space in the power modular building unit, with the power modular building unit including power distribution equipment, power filtering equipment and uninterruptible power supplies and further configured to deliver electric power to the instrumentation modular building unit; and
a cooling modular unit having a base connected to one of the instrumentation modular building unit and power modular building unit, with the cooling modular building unit comprising an air conditioner unit and a water chiller unit, with cooling modular unit disposed over both the instrumentation modular building unit and the power unit modular building unit, and the cooling modular unit connected to one of the instrumentation modular building unit and the power unit modular building unit;
wherein the cooling unit of each of the plurality of building stacks is connected to a like one of the instrumentation modular building unit and the power unit modular building unit of each stack.

21. The building system of claim 20 further comprising:
a circulation core module to provide access to a first one of the instrumentation modular building units and a first one of power modular building units, of one of the plurality of stacks, the circulation core comprising:
at least one stair module, at least one elevator module, at least one loading dock module.

22. The building system of claim 20 wherein the power modular building units are placed on a site, the instrumentation modular building units are stacked over the power unit modular building unit, and the cooling modular units are stacked over instrumentation modular building unit.

23. The building system of claim 20 wherein the instrumentation modular building units placed on a site, the power modular building units are stacked over the instrumentation modular building units, and the cooling modular units are stacked over the power modular building units.

24. The building system of claim 20, further comprising:
a roof structure have a first cantilevered support attached to the instrumentation modular building unit to support by the cantilevered portion over sidewalls of the instrumentation modular building unit the air conditioner unit and the water chiller unit.

25. The building system of claim 20 wherein the contiguous open space in instrumentation modular building units are user-accessible among the instrumentation modular building units via the door of each the instrumentation modular building units.

26. The building system of claim 1 wherein the base of the instrumentation modular building unit is a floor structure that is perforated.

27. The building system of claim 1 wherein the roof of the instrumentation modular building unit is perforated.

28. The building system of claim 20 wherein the bases of the instrumentation modular building units are floor structures that are perforated.

29. The building system of claim 20 wherein the roofs of the instrumentation modular building units are perforated.

30. The building system of claim 20 wherein at least some of the sidewalls of the instrumentation modular building units are panelized.

31. A building system for housing electronic equipment, the building system comprising:
a building stack, the building stack being a vertical stack of three building units with the building stack comprising:
a first one of the building units of the building stack being an instrumentation modular building unit comprising:
a first floor structure
a first roof structure; and
a first plural of sidewalls supporting the first roof over the first floor structure, and with the sidewalls supporting an exterior envelope covering that has insulation for thermal insulation, with at least some of the first plural of sidewalls having a door-way region for accommodating one of an infill unit or a door unit in at least one sidewall and with an internal configuration of space in the instrumentation modular building unit configured to house electronics equipment;
a second one of the building units of the building stack being an electric power modular building unit comprising:
a second floor structure
a second roof structure; and
a second plural of sidewalls supporting the second roof over the second floor structure, and with the second plurality of sidewalls supporting an second exterior envelope covering that has insulation for thermal insulation and having a pair of openings in sidewalls to provide door-way regions for accommodating one of infill units or doors and with an internal configuration of space in the power modular building unit storing power distribution equipment, power filtering equipment and uninterruptible power supplies to deliver electronic power to the instrumentation modular building unit; and
a third one of the building units of the building stack being a cooling modular unit having a base and comprising an air conditioner unit and a water chiller unit, with the base of the cooling modular unit being connected to one of the instrumentation modular building unit and the power unit modular building unit to provide the vertical stack of three units.

32. A building system for housing electronic equipment, the building system comprising:
- a plurality of building stacks, each being a vertical stack of at least three modular building units, with each building stack disposed against and directed connected to an adjacent one of the building stacks, each building stack comprising:
  - an instrumentation modular building unit having a plurality of sidewalls and a base connected to the plurality of sidewalls, with an internal configuration of space in the instrumentation modular building unit configured to house electronics equipment;
  - a power modular building unit a plurality of sidewalls and a base connected to the plurality of sidewalls, with an internal configuration of space in the power modular building unit configured for power distribution equipment, power filtering equipment and uninterruptible power supplies to deliver electric power to the instrumentation modular building unit; and
  - a cooling modular unit having a base that is connected to one of the instrumentation modular building unit and power modular building unit, with the cooling modular building unit comprising an air conditioner unit and a water chiller unit and with cooling modular unit disposed over both the instrumentation modular building unit and the power unit modular building unit, and the cooling modular unit and connected to one of the instrumentation modular building unit and the power unit modular building unit;
- the cooling unit of each of the plurality of building stacks is connected to a like one of the instrumentation modular building unit and the power unit modular building unit of each stack, and
- a circulation core module comprising at least one stair module, at least one elevator module, at least one loading dock module, the circulation core disposed adjacent a first one of the building stacks to provide user accessibility to the respective the power module building unit and the instrumentation modular building units of each of the building stacks through contiguous space with each of the modular building units.

* * * * *